(12) United States Patent
Hasegawa et al.

(10) Patent No.: US 12,308,817 B2
(45) Date of Patent: May 20, 2025

(54) JOINED BODY AND SURFACE ACOUSTIC WAVE DEVICE

(71) Applicant: Sumitomo Electric Industries, Ltd., Osaka (JP)

(72) Inventors: Masato Hasegawa, Osaka (JP);
Yuichiro Yamanaka, Osaka (JP);
Yoshihiro Imagawa, Osaka (JP);
Hirohisa Saito, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 841 days.

(21) Appl. No.: 17/422,774

(22) PCT Filed: Jan. 18, 2019

(86) PCT No.: PCT/JP2019/001551
§ 371 (c)(1),
(2) Date: Jul. 14, 2021

(87) PCT Pub. No.: WO2020/148908
PCT Pub. Date: Jul. 23, 2020

(65) Prior Publication Data
US 2022/0077839 A1    Mar. 10, 2022

(51) Int. Cl.
*H03H 9/02* (2006.01)
*H03H 9/145* (2006.01)
*H03H 9/25* (2006.01)

(52) U.S. Cl.
CPC ........ *H03H 9/02559* (2013.01); *H03H 9/145* (2013.01); *H03H 9/25* (2013.01)

(58) Field of Classification Search
CPC .......................... H03H 9/02559; H03H 9/145
USPC ...... 310/313 R, 313 A, 313 B, 313 C, 313 D
See application file for complete search history.

(56) References Cited

U.S. PATENT DOCUMENTS

| | | | |
|---|---|---|---|
| 2012/0091856 A1* | 4/2012 | Tsuji | H03H 9/02015 |
| | | | 428/141 |
| 2012/0231218 A1 | 9/2012 | Nakayama et al. | |
| 2016/0133823 A1 | 5/2016 | Tai et al. | |
| 2017/0033765 A1 | 2/2017 | Moriya et al. | |
| 2017/0279435 A1 | 9/2017 | Geshi et al. | |

(Continued)

FOREIGN PATENT DOCUMENTS

| | | |
|---|---|---|
| CN | 107406335 A | 11/2017 |
| JP | H07-335513 A | 12/1995 |

(Continued)

OTHER PUBLICATIONS

Garrou, Handbook of 3D Integration, Technology and Applications of 3D Integrated Circuits, China Aerospace Press, May 31, 2017, pp. 413-417, with attached machine English Language Translation.

*Primary Examiner* — Derek J Rosenau
(74) *Attorney, Agent, or Firm* — Faegre Drinker Biddle & Reath LLP

(57) ABSTRACT

Provided is a joined body including a piezoelectric substrate and a polycrystalline spinel substrate provided on one main surface of the piezoelectric substrate, wherein a ratio T1/T2 between T1 and T2 is 0.1 or less, where the T1 represents an average thickness of the piezoelectric substrate and the T2 represents an average thickness of the polycrystalline spinel substrate, and the polycrystalline spinel substrate has a TTV of 1.5 μm or less in a main surface which contacts the piezoelectric substrate.

6 Claims, 3 Drawing Sheets

(56) References Cited

U.S. PATENT DOCUMENTS

| | | |
|---|---|---|
| 2019/0007024 A1 | 1/2019 | Broekaart et al. |
| 2019/0253035 A1 | 8/2019 | Yamanouchi |
| 2019/0326878 A1* | 10/2019 | Kakita ............... H03H 9/02559 |

FOREIGN PATENT DOCUMENTS

| | | |
|---|---|---|
| JP | 2006-246538 A | 9/2006 |
| JP | 2006-304206 A | 11/2006 |
| JP | 2011-066818 A | 3/2011 |
| JP | 2014-147054 A | 8/2014 |
| JP | 2014-229943 A | 12/2014 |
| JP | 2016-100744 A | 5/2016 |
| JP | 2017-034363 A | 2/2017 |
| JP | 2019-192994 A | 10/2019 |
| WO | WO-2015/012005 A1 | 1/2015 |
| WO | WO-2015/053127 A1 | 4/2015 |
| WO | WO-2018/151146 A1 | 8/2018 |

* cited by examiner

JOINED BODY AND SURFACE ACOUSTIC WAVE DEVICE

TECHNICAL FIELD

The present disclosure relates to a joined body and a surface acoustic wave device.

BACKGROUND ART

Inside a mobile phone, an electronic component called a surface acoustic wave (SAW) filter for cutting the noise of electrical signals and transmitting/receiving only an electrical signal having a desired frequency is embedded. For the SAW filter, a piezoelectric substrate made of a material having a piezoelectric effect is used.

On one surface of the piezoelectric substrate, a comb-shaped electrode having a pitch according to the wavelength of a transmission frequency band is formed. Due to an electrical signal inputted to the comb-shaped electrode, the piezoelectric substrate is subjected to stress and deformed, and an acoustic wave according to the pitch is generated.

The transmission frequency of the SAW filter is determined by the pitch of the comb-shaped electrode. The pitch of the comb-shaped electrode changes due to expansion/contraction of the piezoelectric substrate caused by a change in ambient temperature. In order to suppress a change due to thermal expansion, a high strength and low thermal expansion support substrate is attached to a surface of the piezoelectric substrate opposite to the surface having the comb-shaped electrode formed thereon.

In PTL 1 (Japanese Patent Laying-Open No. 2006-304206), a silicon substrate is used as the support substrate described above. The thermal expansion coefficient of silicon is extremely low, when compared with the thermal expansion coefficient of a material forming the piezoelectric substrate, such as lithium tantalate. Therefore, when the piezoelectric substrate expands due to heat, silicon may be broken.

Further, a technique of using sapphire as the support substrate described above has also been proposed. However, since sapphire is a single crystal and has a high hardness, it is difficult to shape sapphire into a desired shape for downsizing. In addition, a single-crystal substrate of silicon or sapphire is generally expensive, and thus there has been a demand for a lower cost substrate.

Accordingly, PTL 2 (Japanese Patent Laying-Open No. 2011-66818) discloses a technique of using spinel, which is lower in cost and has a moderate strength, as a support substrate.

CITATION LIST

Patent Literature

PTL 1: Japanese Patent Laying-Open No. 2006-304206
PTL 2: Japanese Patent Laying-Open No. 2011-66818

SUMMARY OF INVENTION

[1] A joined body in accordance with one aspect of the present disclosure includes a piezoelectric substrate, and a polycrystalline spinel substrate provided on one main surface of the piezoelectric substrate, wherein
a ratio T1/T2 between T1 and T2 is 0.1 or less, where the T1 represents an average thickness of the piezoelectric substrate and the T2 represents an average thickness of the polycrystalline spinel substrate, and
the polycrystalline spinel substrate has a total thickness variation (TTV) of 1.5 μm or less in a main surface which contacts the piezoelectric substrate.

[2] A surface acoustic wave device in accordance with another aspect of the present disclosure is a surface acoustic wave device including
the joined body described above, and
an electrode provided on a main surface of the piezoelectric substrate opposite to the main surface provided with the polycrystalline spinel substrate.

DETAILED DESCRIPTION

Problem to be Solved by the Present Disclosure

The present inventors fabricated a surface acoustic wave device using the substrate made of spinel of PTL 2, and evaluated the performance thereof. As a result, it has been confirmed that, although the substrate has a sufficient strength, variation may occur in frequency temperature characteristic (TCF).

Accordingly, an object of the present disclosure is to provide a joined body including a polycrystalline spinel substrate and having an excellent frequency temperature characteristic with little variation, and a surface acoustic wave device including the joined body.

Advantageous Effect of the Present Disclosure

According to the aspect described above, it is possible to provide a joined body including a polycrystalline spinel substrate and having an excellent frequency temperature characteristic with little variation, and a surface acoustic wave device including the joined body.

SUMMARY OF EMBODIMENTS

First, aspects of the present disclosure will be described in list form.

(1) A joined body in accordance with one aspect of the present disclosure is a joined body including a piezoelectric substrate, and a polycrystalline spinel substrate provided on one main surface of the piezoelectric substrate, wherein
a ratio T1/T2 between T1 and T2 is 0.1 or less, where the T1 represents an average thickness of the piezoelectric substrate and the T2 represents an average thickness of the polycrystalline spinel substrate, and
the polycrystalline spinel substrate has a TTV of 1.5 μm or less in a main surface which contacts the piezoelectric substrate.

Figure 5:
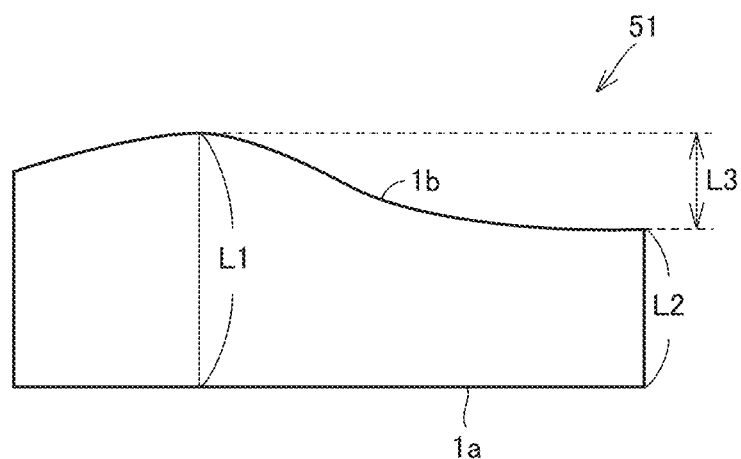
FIG. 5 is a view for explaining the TTV.

According to the aspect described above, the joined body includes the polycrystalline spinel substrate, and can have an excellent frequency temperature characteristic with little variation. Here, in the present specification, the frequency temperature characteristic (TCF) is a value indicating a change in frequency caused by a change in ambient temperature (unit: ppm/° C.). As the TCF has a smaller value, the TCF indicates that the temperature characteristic is more excellent. In addition, in the present specification, the TTV is a value indicating the difference between the maximum value and the minimum value of the distance from a back surface to a surface opposite to the back surface of a substrate. For example, in a polycrystalline spinel substrate 51 shown in FIG. 5, a value L3 of the difference between a maximum value L1 and a minimum value L2 of the distance from a back surface 1a to a surface (opposite surface) 1b opposite to back surface 1a of polycrystalline spinel substrate 51 corresponds to the TTV.

(2) Preferably, the T1/T2 is 0.0002 or more and 0.1 or less. Thereby, the variation in frequency temperature characteristic can be further reduced.

(3) Preferably, the T1 is 0.1 μm or more and 25 μm or less, and the T2 is 100 μm or more and 500 μm or less.

Thereby, the piezoelectric substrate can successfully suppress loss of a surface acoustic wave, and the polycrystalline spinel substrate can sufficiently suppress thermal expansion of the piezoelectric substrate.

(4) Preferably, the piezoelectric substrate is made of lithium tantalate or lithium niobate. Thereby, the piezoelectric substrate can have an increased electromechanical coupling coefficient, and the piezoelectric substrate can have an improved frequency filtering characteristic.

(5) Preferably, a total thickness of the T1 and the T2 is 100.1 μm or more and 525 μm or less, each main surface of the polycrystalline spinel substrate has a shape of a circle with a diameter of 100 mm or more and 200 mm or less, or a shape with an orientation flat formed in the circle, and the joined body has a TTV of 10 μm or less in each outer surface thereof.

Thereby, the piezoelectric substrate can successfully suppress the loss of a surface acoustic wave, and the joined body can have an excellent frequency temperature characteristic with less variation.

(6) A surface acoustic wave device in accordance with another aspect of the present disclosure is a surface acoustic wave device including the joined body described above, and an electrode provided on a main surface of the piezoelectric substrate opposite to the main surface provided with the polycrystalline spinel substrate.

According to the aspect described above, the surface acoustic wave device can have an excellent frequency temperature characteristic with little variation.

DETAILS OF EMBODIMENTS

Specific examples of a joined body and a surface acoustic wave device in accordance with one embodiment of the present disclosure will be described below with reference to the drawings. In the drawings of the present disclosure, the same reference numerals designate identical or corresponding parts. In addition, dimensional relations in length, width, thickness, depth, and the like are changed as appropriate for clarity and simplicity of the drawings, and do not necessarily represent actual dimensional relations.

In the present specification, an expression in the form of "A to B" means lower and upper limits of a range (that is, A or more and B or less), and when A is not accompanied by any unit and B is alone accompanied by a unit, A has the same unit as B. In addition, an expression that the upper limit value of a range is C means that the upper limit of the range is C or less, and an expression that the lower limit value of a range is D means that the lower limit of the range is D or more.

First Embodiment: Joined Body

<Joined Body>

Figure 1:
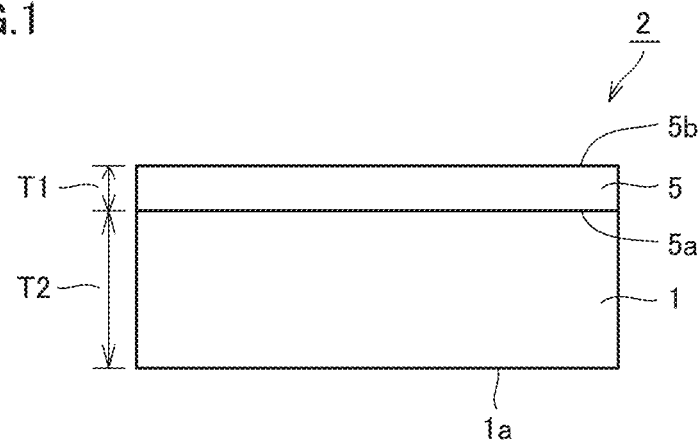
FIG. 1 is a schematic cross sectional view of a joined body in accordance with one embodiment of the present disclosure.

A joined body in accordance with the present embodiment will be described using FIG. 1. As shown in FIG. 1, a joined body 2 in accordance with the present embodiment includes a piezoelectric substrate 5, and a polycrystalline spinel substrate 1 provided on one main surface (hereinafter also referred to as a "first main surface") 5a of piezoelectric substrate 5. A ratio T1/T2 between T1 and T2 is 0.1 or less, where T1 represents an average thickness of the piezoelectric substrate and T2 represents an average thickness of the polycrystalline spinel substrate. The polycrystalline spinel substrate has a TTV of 1.5 μm or less in a main surface which contacts the piezoelectric substrate.

As a result of earnest studies, the present inventors have newly found that a joined body including a piezoelectric substrate and a polycrystalline spinel substrate provided on one main surface of the piezoelectric substrate, wherein a ratio T1/T2 between T1 and T2 is 0.1 or less, where T1 represents an average thickness of the piezoelectric substrate and T2 represents an average thickness of the polycrystalline spinel substrate, and the polycrystalline spinel substrate has a TTV of 1.5 μm or less in a main surface which contacts the piezoelectric substrate, can have an excellent frequency temperature characteristic with little variation. Although the reason therefor is not clearly known, it is presumed as described below in (i) and (ii).

(i) In the joined body in accordance with the present embodiment, T1/T2 is 0.1 or less, and thus average thickness T2 of the polycrystalline spinel substrate is sufficiently large relative to average thickness T1 of the piezoelectric substrate. Accordingly, the polycrystalline spinel substrate can sufficiently suppress the thermal expansion of the piezoelectric substrate, and the joined body can have an excellent frequency temperature characteristic with little variation.

(ii) In the joined body in accordance with the present embodiment, the polycrystalline spinel substrate has a TTV of 1.5 μm or less in a main surface which contacts the piezoelectric substrate. Accordingly, the polycrystalline spinel substrate has a uniform thickness, and can sufficiently suppress the thermal expansion of the piezoelectric substrate across the entire surface of the polycrystalline spinel substrate. Therefore, the joined body can have an excellent frequency temperature characteristic with little variation.

(Shape)

The average thickness of joined body 2 is preferably 100.1 μm or more and 525 μm or less, more preferably 200.1 μm or more and 510 μm or less, and further preferably 101 μm or more and 510 μm or less. Here, the thickness of the joined body is a value measured in a cross section parallel to the direction of a normal to a main surface of the joined body, with a digital micrometer. The measurement is performed at three positions in one cross section, and the average value of thicknesses at the three positions is obtained as the average thickness of the joined body.

It should be noted that, in the measurement performed by the Applicant, it has been confirmed that, as long as the measurement is performed in the same sample, even though the average thickness of the joined body is calculated a plurality of times while changing the location for selecting an observed cross section, calculation results have almost no variation, and thus there is no arbitrariness even when any observed cross section is set.

It should be noted that, although the main surface of the joined body described above includes a front surface 5b of the piezoelectric substrate and back surface 1a of the polycrystalline spinel substrate, the main surface of the joined body in the present specification shall indicate front surface 5b of the piezoelectric substrate.

The shape and the size of the main surface of joined body 2 are not particularly limited, and can be adjusted as appropriate depending on the usage of the surface acoustic wave device. Here, the main surface of joined body 2 includes both a main surface on the piezoelectric substrate 5 side and a main surface on the polycrystalline spinel substrate 1 side. The main surface of joined body 2 may have a shape of a circle, or may have a shape of a rectangle, for example. When the shape of the main surface of joined body 2 is a circle, the diameter thereof can be ϕ100 mm or more and ϕ200 mm or less. When the shape of the main surface of joined body 2 is a rectangle, the one side length thereof can be 70 mm or more and 142 mm or less. An orientation flat may be formed in the main surface of joined body 2. Preferably, joined body 2 has a TTV of 10 μm or less in each outer surface thereof.

(Joining Between Piezoelectric Substrate and Polycrystalline Spinel Substrate)

The method of joining piezoelectric substrate 5 and polycrystalline spinel substrate 1 is not particularly limited, and they may be joined using an adhesive, or may be joined by van der Waals force. In order to join the piezoelectric substrate and the polycrystalline spinel substrate with high accuracy, it is preferable that the piezoelectric substrate and the polycrystalline spinel substrate are joined by the van der Waals force. More specifically, it is preferable that atoms of a material constituting the piezoelectric substrate are joined to atoms of spinel constituting the polycrystalline spinel substrate by the van der Waals force.

<Piezoelectric Substrate>

Piezoelectric substrate 5 is a substrate which exhibits a piezoelectric effect of converting an electrical signal into mechanical vibration. As a main component of piezoelectric substrate 5, for example, lithium tantalate, lithium niobate, lithium borate, or the like can be used. Among these components, lithium tantalate or lithium niobate, which is excellent in electromechanical coupling coefficient, is preferable. Piezoelectric substrate 5 can be obtained, for example, by producing a single crystal rod of the component described above by the Czochralski method, and slicing the single crystal rod. It should be noted that the substrate orientation (cut angle) can be set to 36° to 50°, for example, and can be selected as appropriate depending on the usage of the surface acoustic wave device, and the like.

Average thickness T1 of piezoelectric substrate 5 is preferably 0.1 μm or more and 25 μm or less. When average thickness T1 of piezoelectric substrate 5 is less than 0.1 μm, the loss of a surface acoustic wave may increase, or it may become difficult to process piezoelectric substrate 5. When average thickness T1 of piezoelectric substrate 5 is more than 25 μm, expansion or contraction of piezoelectric substrate 5 due to a temperature change may increase, or joined body 2 may become unnecessarily thick. The lower limit of average thickness T1 of piezoelectric substrate 5 is preferably 0.1 μm, more preferably 1 μm, and further preferably 3 μm. On the other hand, the upper limit of average thickness T1 of piezoelectric substrate 5 is preferably 25 μm, more preferably 15 μm, and further preferably 10 μm. The average thickness of piezoelectric substrate 5 is more preferably 1 μm or more and 15 μm or less, and further preferably 3 μm or more and 10 μm or less.

The thickness of the piezoelectric substrate described above can be confirmed by measuring the thickness of the joined body and the thickness of the polycrystalline spinel substrate, and subtracting the thickness of the polycrystalline spinel substrate from the thickness of the joined body. The thickness of the joined body can be measured with a digital micrometer. The thickness of the polycrystalline spinel substrate can be measured with a micrometer.

It should be noted that, in the measurement performed by the Applicant, it has been confirmed that, as long as the measurement is performed in the same sample, even though the average thickness of the piezoelectric substrate is calculated a plurality of times while changing the location for selecting an observed cross section, calculation results have almost no variation, and thus there is no arbitrariness even when any observed cross section is set.

The upper limit of the arithmetic average roughness (Ra) of first main surface 5a of piezoelectric substrate 5 is preferably 1 nm, and more preferably 0.8 nm. When the arithmetic average roughness (Ra) of first main surface 5a of piezoelectric substrate 5 is more than 1 nm, the strength of adhesion to polycrystalline spinel substrate 1 by the van der Waals force may decrease. On the other hand, the lower limit of the arithmetic average roughness (Ra) of first main surface 5a of piezoelectric substrate 5 is preferably 0.05 nm. When the arithmetic average roughness (Ra) of first main surface 5a of piezoelectric substrate 5 is less than 0.05 nm, a bulk wave may be likely to be reflected between piezoelectric substrate 5 and polycrystalline spinel substrate 1 and thus spurious response may increase, or the area of adhesion between piezoelectric substrate 5 and polycrystalline spinel substrate 1 may decrease and thus the strength of adhesion between piezoelectric substrate 5 and polycrystalline spinel substrate 1 by the van der Waals force may decrease.

In the present specification, the arithmetic average roughness (Ra) means the arithmetic average roughness defined in JIS B 0601. The arithmetic average roughness is a value measured with an atomic force microscope (AFM).

The upper limit of the linear expansion coefficient of piezoelectric substrate 5 is preferably $30 \times 10^{-6}/°$ C., and more preferably $20 \times 10^{-6}/°$ C. When the linear expansion coefficient of piezoelectric substrate 5 is more than $30 \times 10^{-6}/°$ C., expansion or contraction of the piezoelectric substrate due to a temperature change may increase. On the other hand, although the lower limit of the linear expansion coefficient of piezoelectric substrate 5 is not particularly limited, it is preferably $8 \times 10^{-6}/°$ C., and more preferably $10 \times 10^{-6}/°$ C., for example.

The linear expansion coefficient described above is a value measured by a compressive load method (with "Thermomechanical Analyzer TMA8310" manufactured by Rigaku Corporation).

Piezoelectric substrate 5 may contain a component other than the main component described above, and, for example, a metal may be added thereto. The mechanical strength, the heat resistance, and the like of piezoelectric substrate 5 can be improved by adding a metal element thereto.

<Polycrystalline Spinel Substrate>

Polycrystalline spinel substrate 1 is a substrate made of a spinel sintered body. Polycrystalline spinel substrate 1 is a support substrate for increasing the strength of joined body 2 and suppressing the thermal expansion of the piezoelectric substrate. Examples of spinel constituting polycrystalline spinel substrate 1 include $MgO \cdot nAl_2O_3$ ($1 \leq n \leq 3$). The lower limit of the value of n is preferably 1, more preferably 1.03, and further preferably 1.05. When the value of n is less than 1, there is a tendency that MgO increases locally and porosity increases. The upper limit of the value of n is preferably 3, more preferably 2, and further preferably 1.5. When the value of n is more than 3, there is a tendency that $Al_2O_3$ increases locally, the $Al_2O_3$ is unevenly distributed with pores, and white turbidity visually increases.

The composition of the polycrystalline spinel substrate and the value of n in the composition formula $MgO \cdot nAl_2O_3$ can be measured by an X-ray diffraction matrix flushing method.

Polycrystalline spinel substrate 1 may contain a component other than spinel, and can contain an alumina component, for example. The upper limit value of the content of the component other than spinel in the polycrystalline spinel substrate is preferably 10 mass %, and more preferably 5 mass %. The lower limit value of the content of the component other than spinel in the polycrystalline spinel substrate is preferably 3 mass %, more preferably 1 mass %, and further preferably 0, that is, it is further preferable that the polycrystalline spinel substrate does not contain a component other than spinel.

Average thickness T2 of polycrystalline spinel substrate 1 is preferably 100 µm or more and 500 µm or less. When average thickness T2 of polycrystalline spinel substrate 1 is less than 100 µm, it may not be possible to sufficiently suppress the thermal expansion of the piezoelectric substrate. When average thickness T2 of polycrystalline spinel substrate 1 is more than 500 µm, a bulk wave may be likely to be reflected at a boundary between piezoelectric substrate 5 and polycrystalline spinel substrate 1, or joined body 2 may become unnecessarily thick. The lower limit of average thickness T2 of polycrystalline spinel substrate 1 is preferably 100 µm, more preferably 150 µm, and further preferably 200 µm. On the other hand, the upper limit of average thickness T2 of polycrystalline spinel substrate 1 is preferably 500 µm, more preferably 400 µm, and further preferably 300 µm. Average thickness T2 of polycrystalline spinel substrate 1 is more preferably 150 µm or more and 400 µm or less, and further preferably 200 µm or more and 300 µm or less.

The thickness of the polycrystalline spinel substrate described above is a value measured in a cross section parallel to the direction of a normal to back surface 1a of the polycrystalline spinel substrate, with a micrometer. The measurement is performed at three positions in one cross section, and the average value of thicknesses at the three positions is obtained as the average thickness of the polycrystalline spinel substrate.

It should be noted that, in the measurement performed by the Applicant, it has been confirmed that, as long as the measurement is performed in the same sample, even though the average thickness of the polycrystalline spinel substrate is calculated a plurality of times while changing the location for selecting an observed cross section, calculation results have almost no variation, and thus there is no arbitrariness even when any observed cross section is set.

T1/T2, which is the ratio between average thickness T1 of piezoelectric substrate 5 and average thickness T2 of polycrystalline spinel substrate 1, is 0.1 or less, and thus average thickness T2 of the polycrystalline spinel substrate is sufficiently large relative to average thickness T1 of the piezoelectric substrate. Accordingly, the polycrystalline spinel substrate can sufficiently suppress the thermal expansion of the piezoelectric substrate, and the joined body can have an excellent frequency temperature characteristic with little variation.

The upper limit of the ratio T1/T2 described above is 0.1, preferably 0.04, and more preferably 0.02. When the ratio T1/T2 is more than 0.1, the frequency temperature characteristic (TCF) tends to be deteriorated.

On the other hand, the lower limit of the ratio T1/T2 described above is preferably 0.0002, more preferably 0.002, and further preferably 0.006. When the ratio T1/T2 is less than 0.0002, the processing accuracy of piezoelectric substrate 5 may decrease. Further, deformation of joined body 2 due to a temperature change may increase, or the mechanical strength thereof may decrease.

The ratio T1/T2 described above is preferably 0.0002 or more and 0.1 or less, more preferably 0.002 or more and 0.04 or less, and further preferably 0.006 or more and 0.02 or less.

Polycrystalline spinel substrate 1 has a TTV of 1.5 µm or less in a main surface (corresponding to opposite surface 1b) which contacts piezoelectric substrate 5. Accordingly, the polycrystalline spinel substrate has a uniform film thickness, and can sufficiently suppress the thermal expansion of the piezoelectric substrate across the entire surface of the polycrystalline spinel substrate. Therefore, the joined body can have an excellent frequency temperature characteristic with little variation.

The upper limit value of the TTV is 1.5 µm, preferably 1.2 µm, more preferably 0.9 µm, and further preferably 0.7 µm. When the TTV is more than 1.5 µm, there is a tendency that the film thickness of the polycrystalline spinel substrate becomes non-uniform, and the frequency temperature characteristic of the joined body varies.

On the other hand, although the lower limit value of the TTV is not particularly limited, it is preferably 0.1 µm, and more preferably 0.5 µm, from the viewpoint of manufacturing.

The TTV is preferably 0.1 µm or more and 1.5 µm or less, more preferably 0.1 µm or more and 1.2 µm or less, and further preferably 0.5 µm or more and 0.7 µm or less.

The TTV described above is measured with a flatness measuring instrument ("FlatMaster 200XRA-Wafer" manufactured by Tropel Corporation). The measured region is the entire main surface (corresponding to opposite surface 1b) of the polycrystalline spinel substrate which contacts the piezoelectric substrate in the joined body.

When the total thickness of T1 and T2 is 100.1 µm or more and 525 µm or less, each main surface of the polycrystalline spinel substrate has a shape of a circle with a diameter of 100 mm or more and 200 mm or less or a shape with an orientation flat formed in the circle, and the polycrystalline spinel substrate has a TTV of 1.5 µm or less in the main surface which contacts the piezoelectric substrate, the joined body can have a TTV of 10 µm or less in each outer surface thereof.

Preferably, the polycrystalline spinel substrate includes a plurality of crystal grains, and the crystal grains have an average grain diameter of 1 µm or more and 60 µm or less. Thereby, the loss of an acoustic wave can be suppressed more effectively.

When the average grain diameter of the crystal grains described above is less than 1 µm, the porosity of the polycrystalline spinel substrate increases too much and the elastic modulus thereof decreases, and thus it tends to be difficult to achieve the effect as a support substrate of suppressing the thermal expansion of the piezoelectric substrate. Further, the area of contact points at a joining interface between the polycrystalline spinel substrate and the piezoelectric substrate decreases, and thus the joining strength decreases. On the other hand, when the average grain diameter of the crystal grains described above is more than 60 μm, pores present at grain boundaries between spinel grains tend to be unevenly distributed. The average grain diameter of the polycrystalline spinel substrate is more preferably 5 μm or more and 30 μm or less, and further preferably 8 μm or more and 30 μm or less.

In the present specification, the "average grain diameter" means a median diameter (d50) in volume-based grain size distribution (volume distribution), and means an average grain diameter of all spinel grains included in the polycrystalline spinel substrate.

The grain diameter of each grain for calculating the average grain diameter of the spinel grains can be measured by the following method. First, a surface of the polycrystalline spinel substrate is mirror-polished, and a measurement visual field of 10 mm×10 mm is determined on the polished surface. A reflected electron image of the polycrystalline spinel substrate in the measurement visual field is observed with an electron microscope at a magnification of 5000 times. Then, in this reflected electron image, a diameter of a circle circumscribed about a grain constituting the polycrystalline spinel substrate (that is, a circumscribed circle equivalent diameter) is measured, and the diameter is determined as the grain diameter of a spinel grain.

It should be noted that, in the measurement performed by the Applicant, it has been confirmed that, as long as the measurement is performed in the same sample, even though the average grain diameter of the crystal grains included in the polycrystalline spinel substrate is calculated a plurality of times while changing the location for selecting a measurement visual field, calculation results have almost no variation, and thus there is no arbitrariness even when any measurement visual field is set.

The lower limit of the arithmetic average roughness (Ra) of the surface of polycrystalline spinel substrate 1 is preferably 0.01 nm, and more preferably 0.1 nm. When the arithmetic average roughness (Ra) of the surface of polycrystalline spinel substrate 1 is less than 0.01 nm, it is necessary to process polycrystalline spinel substrate 1 to have a very flat surface, and thus the processing cost tends to increase. On the other hand, the upper limit of the arithmetic average roughness (Ra) of the surface of polycrystalline spinel substrate 1 is preferably 3.0 nm, and more preferably 2.0 nm. When the arithmetic average roughness (Ra) of the surface of polycrystalline spinel substrate 1 is more than 3.0 nm, the adhesion strength may decrease in the case of adhesion between piezoelectric substrate 5 and polycrystalline spinel substrate 1 by the van der Waals force.

The upper limit of the linear expansion coefficient of polycrystalline spinel substrate 1 is preferably $16\times10^{-6}/°$ C., and more preferably $8\times10^{-6}/°$ C. When the linear expansion coefficient of polycrystalline spinel substrate 1 is more than $16\times10^{-6}/°$ C., it may not be possible to sufficiently suppress the thermal expansion of the piezoelectric substrate. On the other hand, the lower limit of the linear expansion coefficient of polycrystalline spinel substrate 1 is preferably $1\times10^{-6}/°$ C., and more preferably $3\times10^{-6}/°$ C. When the linear expansion coefficient of polycrystalline spinel substrate 1 is less than $1\times10^{-6}/°$ C., the difference in linear expansion coefficient between polycrystalline spinel substrate 1 and piezoelectric substrate 5 may increase, and distortion of polycrystalline spinel substrate 1 may increase when the temperature changes.

The linear expansion coefficient described above is a value obtained through measurement in a rod-shaped material with a linear thermal expansion measuring device.

The lower limit of the difference in linear expansion coefficient between polycrystalline spinel substrate 1 and piezoelectric substrate 5 is preferably $5\times10^{-6}/°$ C., and more preferably $7\times10^{-6}/°$ C. When the difference in linear expansion coefficient between polycrystalline spinel substrate 1 and piezoelectric substrate 5 is less than $5\times10^{-6}/°$ C., it may not be possible to sufficiently suppress the thermal expansion of the piezoelectric substrate. On the other hand, the upper limit of the difference in linear expansion coefficient between polycrystalline spinel substrate 1 and piezoelectric substrate 5 is preferably $20\times10^{-6}/°$ C. When the difference in linear expansion coefficient between polycrystalline spinel substrate 1 and piezoelectric substrate 5 is more than $20\times10^{-6}/°$ C., distortion of polycrystalline spinel substrate 1 may increase when the temperature changes.

Polycrystalline spinel substrate 1 supports piezoelectric substrate 5 which vibrates upon receiving an electrical signal. Accordingly, polycrystalline spinel substrate 1 is subjected to a considerable stress. Further, when piezoelectric substrate 5 operates, piezoelectric substrate 5 generates heat, and the heat also propagates to polycrystalline spinel substrate 1. On this occasion, thermal stress is generated in polycrystalline spinel substrate 1. Accordingly, polycrystalline spinel substrate 1 preferably has an appropriate strength.

The lower limit of the Young's modulus of polycrystalline spinel substrate 1 is preferably 100 GPa, more preferably 150 GPa, and further preferably 180 GPa. When the Young's modulus of polycrystalline spinel substrate 1 is less than 100 GPa, polycrystalline spinel substrate 1 may be likely to be broken. On the other hand, the upper limit of the Young's modulus of polycrystalline spinel substrate 1 is preferably 400 GPa, more preferably 350 GPa, and further preferably 300 GPa. When the Young's modulus of polycrystalline spinel substrate 1 is more than 400 GPa, polycrystalline spinel substrate 1 has an excessively high hardness, and thus chipping is highly likely to occur. Further, since polycrystalline spinel substrate 1 has an excessively high hardness, it may become difficult to process polycrystalline spinel substrate 1.

In the present specification, the Young's modulus is a value measured by a three-point bending test performed in conformity with JIS R 1602. The measurement is performed using "Material Testing Machine AL-50NB" manufactured by Minebea Co., Ltd.

The lower limit of the Knoop hardness of polycrystalline spinel substrate 1 is preferably 1000, and more preferably 1200. When the Knoop hardness of polycrystalline spinel substrate 1 is less than 1000, polycrystalline spinel substrate 1 may be likely to be broken. On the other hand, the upper limit of the Knoop hardness of polycrystalline spinel substrate 1 is preferably 2500, and more preferably 1800. When the Knoop hardness of polycrystalline spinel substrate 1 is more than 2500, it may become difficult to process polycrystalline spinel substrate 1.

In the present specification, the Knoop hardness is a value measured with "Hardness Testing Machine HM" manufactured by Mitutoyo Corporation.

<Method for Manufacturing Joined Body>

The method for manufacturing a joined body in accordance with the present embodiment can include a step of preparing a piezoelectric substrate, a step of preparing a polycrystalline spinel substrate, a step of joining the piezoelectric substrate and the polycrystalline spinel substrate to obtain a joined body (hereinafter also referred to as a "joining step"), and a step of adjusting the thickness of the piezoelectric substrate.

(Step of Preparing Piezoelectric Substrate)

First, a piezoelectric substrate is prepared. As the piezoelectric substrate, a conventionally known piezoelectric substrate can be used. Then, main surfaces of the piezoelectric substrate are polished. Specifically, the main surfaces of the piezoelectric substrate are roughly polished by grinding, and thereafter, chemical mechanical polishing (CMP) is performed on a surface to be joined to the polycrystalline spinel substrate, to reduce its surface roughness until it has an arithmetic average roughness (Ra) of about 0.05 µm or more and 1 µm or less.

(Step of Preparing Polycrystalline Spinel Substrate)

The step of preparing a polycrystalline spinel substrate can include a spinel powder preparing step, a molding step, a sintering step, and a processing step.

In the spinel powder preparing step, powder made of spinel and having a composition formula of $MgO \cdot nAl_2O_3$ ($1 \leq n \leq 3$) is prepared. Preferably, the spinel powder has an average particle diameter of 0.1 µm or more and 0.3 µm or less, and a purity of 99.5% or more.

In order to prepare the spinel powder having the composition described above, it is preferable to mix MgO (magnesium oxide) powder and $Al_2O_3$ (alumina) powder at a mixing ratio (mass ratio) of $1 \leq Al_2O_3/MgO \leq 3$.

The particle diameter of each particle for calculating the average particle diameter of the spinel powder is measured using a particle diameter distribution measurement method based on a laser diffraction/scattering method. Specifically, it is a method of measuring the diameter of each powder particle by analyzing distribution of the scattering intensity of the scattered light of a laser beam emitted onto the powder particle.

Then, the molding step is performed. Specifically, the spinel powder is molded by press molding or cold isostatic pressing (CIP) to obtain a molded body. More specifically, it is preferable to first preform the powder of $MgO \cdot nAl_2O_3$ prepared in the spinel powder preparing step by press molding, and thereafter perform CIP to obtain a molded body. It should be noted that only one of press molding and CIP may be performed, or both may be performed, for example by performing press molding and thereafter performing CIP.

In the press molding, it is preferable to use a pressure of, for example, 1 MPa or more and 300 MPa or less, and in particular, 10 MPa or more and 100 MPa or less. In the CIP, it is preferable to use a pressure of, for example, 160 MPa or more and 250 MPa or less, and in particular, 180 MPa or more and 230 MPa or less.

Then, the sintering step is performed. Specifically, the molded body is sintered in vacuum under a temperature condition of 1500° C. or more and 1700° C. or less, for 60 minutes or more and 600 minutes or less (a first sintering step), and thereafter is sintered by hot isostatic pressing (HIP) under a temperature condition of 1600° C. or more and 1800° C. or less, for 60 minutes or more and 240 minutes or less (a second sintering step). Thereby, a spinel ingot made of the spinel sintered body can be obtained.

Preferably, the second sintering step described above is performed while changing the pressure in multiple stages. More specifically, the second sintering step preferably includes a second sintering step (a) of sintering the molded body under a temperature condition of 1600° C. or more and 1800° C. or less, under a pressure of 100 MPa or more and 200 MPa or less, for 1 minute or more and 60 minutes or less, and a second sintering step (b) of sintering the molded body under a temperature condition of 1600° C. or more and 1800° C. or less, under a pressure of 150 MPa or more and 300 MPa or less, for 10 minutes or more and 300 minutes or less.

Then, the processing step is performed. Specifically, the obtained spinel ingot is sliced with a diamond wire saw to have a desired thickness. Thereby, a base of a polycrystalline spinel substrate having a desired thickness is completed. Preferably, the desired thickness is determined in consideration of the thickness of the polycrystalline spinel substrate to be finally formed, the polishing allowance of main surfaces of the polycrystalline spinel substrate in a subsequent step, and the like. It should be noted that thickness T2 of the polycrystalline spinel substrate to be finally formed can be 100 µm or more and 500 µm or less, for example.

Then, the main surfaces of the polycrystalline spinel substrate described above are polished. Specifically, the main surfaces of the polycrystalline spinel substrate are roughly polished by grinding, and thereafter, lapping and rough polishing are performed on a surface (opposite surface 1b) to be finally joined to the piezoelectric substrate, in a balanced manner such that a load is uniformly applied onto the substrate surface, to reduce variation in the thickness from back surface 1a such that the surface has a TTV of 1.5 µm or less.

Specifically, the lapping is performed using a single or double-surface lapping machine as a lapping machine, and diamond abrasive grains or the like as a lapping agent. Specifically, the rough polishing is performed using a single or double-surface polishing machine. In both of the lapping and the rough polishing, processing is performed in a balanced manner such that the load is uniformly applied, considering the thickness of a workpiece, the dimensions of a jig, and the like.

Further, it is preferable to perform CMP on the surface (opposite surface 1b) to be joined to the piezoelectric substrate, to reduce its surface roughness until it has an arithmetic average roughness (Ra) of about 0.01 nm or more and 3.0 nm or less. Thereby, the polycrystalline spinel substrate can be joined to the main surface of the piezoelectric substrate by the van der Waals force.

(Joining Step)

Then, the piezoelectric substrate and the polycrystalline spinel substrate prepared above are joined to obtain a joined body. Specifically, the piezoelectric substrate and the polycrystalline spinel substrate are placed within a vacuum chamber such that the polished surface of the polycrystalline spinel substrate faces the polished surface of the piezoelectric substrate. With this state being maintained, an internal gas within the chamber is exhausted to achieve a high vacuum state. Thereafter, a fast atomic beam of neutralized argon is emitted onto the polished surfaces of the both substrates, and then the both substrates are brought closer to each other and joined to obtain a joined body.

(Step of Adjusting Thickness of Piezoelectric Substrate)

In the joined body obtained above, grinding, lapping, and polishing are performed on second main surface 5b of the piezoelectric substrate such that thickness T1 of the piezoelectric substrate becomes equal to a desired thickness. Here, the desired thickness is a thickness that allows T1/T2 to have a value of 0.1 or less, and for example, T1/T2 can have a value of 0.1 μm or more and 25 μm or less. Thereby, a joined body in which T1/T2 has a value of 0.1 or less can be obtained.

It should be noted that, as a result of measuring the thickness of the polycrystalline spinel substrate in the joined body, it has been confirmed that the thickness of the polycrystalline spinel substrate before joining is maintained.

In addition, as a result of measuring the TTV of the main surface (opposite surface 1b) of the polycrystalline spinel substrate which contacts the piezoelectric substrate in the joined body, it has been confirmed that the TTV of the polycrystalline spinel substrate before joining is maintained.

Second Embodiment: Surface Acoustic Wave Device

<Configuration of Surface Acoustic Wave Device>

A surface acoustic wave device in accordance with the present embodiment will be described using FIGS. 2 to 4.

Figure 2:
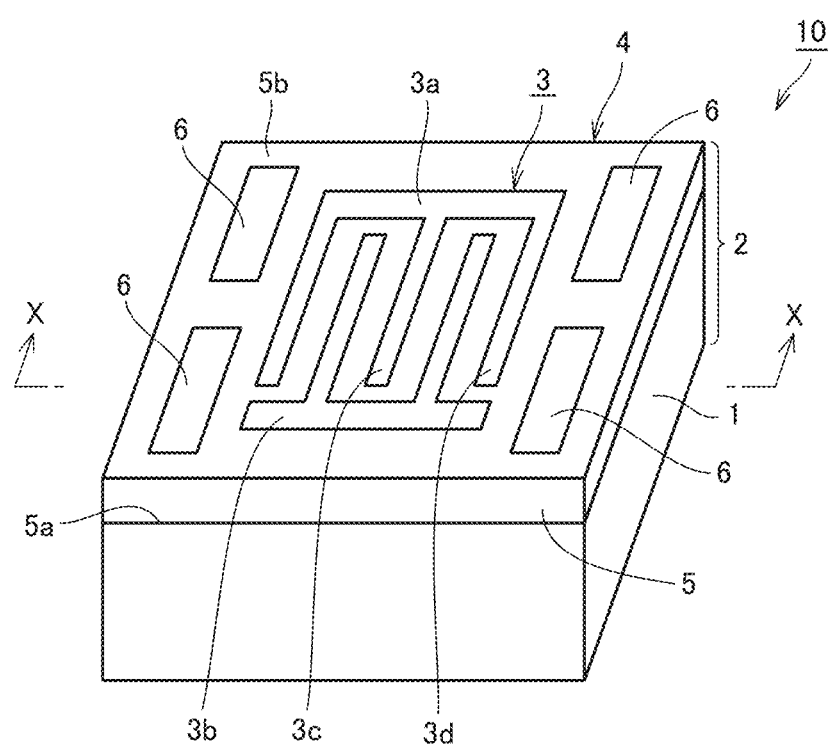
FIG. 2 is a perspective view showing an example of a joined substrate having an electrode formed on a main surface of the joined body of FIG. 1.
Figure 3:
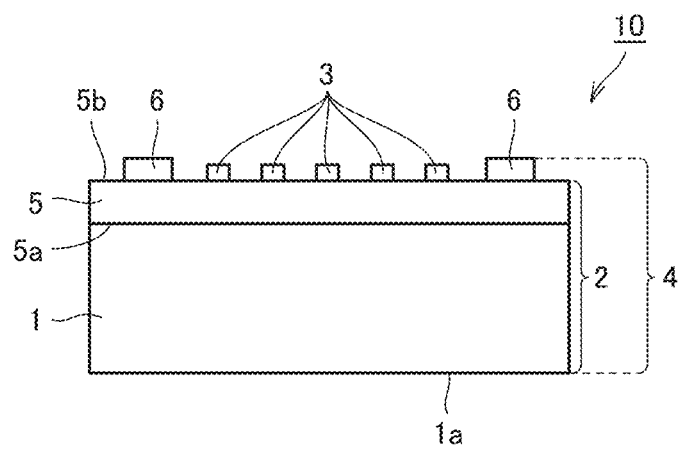
FIG. 3 is a cross sectional view of the joined substrate of FIG. 2 cut along an X-X line.

As shown in FIGS. 2 and 3, a surface acoustic wave device 10 in accordance with the present embodiment includes joined body 2 described in the first embodiment, and an electrode 3 provided on a main surface (second main surface 5b) of piezoelectric substrate 5 opposite to a surface (first main surface 5a) provided with polycrystalline spinel substrate 1. Joined body 2 includes piezoelectric substrate 5, and the polycrystalline spinel substrate provided on one main surface (first main surface 5a) of piezoelectric substrate 5.

Since the configurations of the joined body, the piezoelectric substrate, and the polycrystalline spinel substrate used in the present embodiment are the same as the configurations described in the first embodiment, the description thereof will not be repeated.

Electrode 3 can include a first pole 3a and a second pole 3b. For example, an AC voltage is applied between first pole 3a and second pole 3b. Then, an electrical signal is inputted to a current caused by the AC voltage applied between first pole 3a and second pole 3b. Thereby, crystal grains (atoms) constituting piezoelectric substrate 5 provided with electrode 3 are subjected to stress, and thus come closer to or separate from one another due to the piezoelectric effect. Accordingly, the main surface of piezoelectric substrate 5 vibrates like a wave.

Each of first pole 3a and second pole 3b can have a comb shape. Thus, for example, among electrical signals inputted to electrode 3, only an electrical signal having a wavelength corresponding to the distance between a comb-shaped component 3c and a comb-shaped component 3d of first pole 3a is propagated to the outside. That is, an electrical signal having a wavelength other than the wavelength described above is not propagated to the outside, and is interrupted inside joined body 2. Based on such a principle, joined body 2 can output only an electrical signal having a desired wavelength to the outside, and thereby can interrupt an electrical signal having a wavelength other than the desired wavelength (that is, noise) and eliminate the noise of an output signal.

As shown in FIGS. 2 and 3, second main surface 5b of the piezoelectric substrate can further be provided with an electrode member 6.

It should be noted that, as shown in FIGS. 2 and 3, piezoelectric substrate 5, electrode 3 provided on second main surface 5b of the piezoelectric substrate, and polycrystalline spinel substrate 1 joined to first main surface 5a of the piezoelectric substrate form a joined substrate 4. Joined substrate 4 can further include first electrode member 6.

In the present specification, the surface acoustic wave device may be formed only of joined substrate 4, or may include another component in addition to joined substrate 4, as described below. An example in which the surface acoustic wave device includes another component in addition to joined substrate 4 will be described using FIG. 4.

Figure 4:
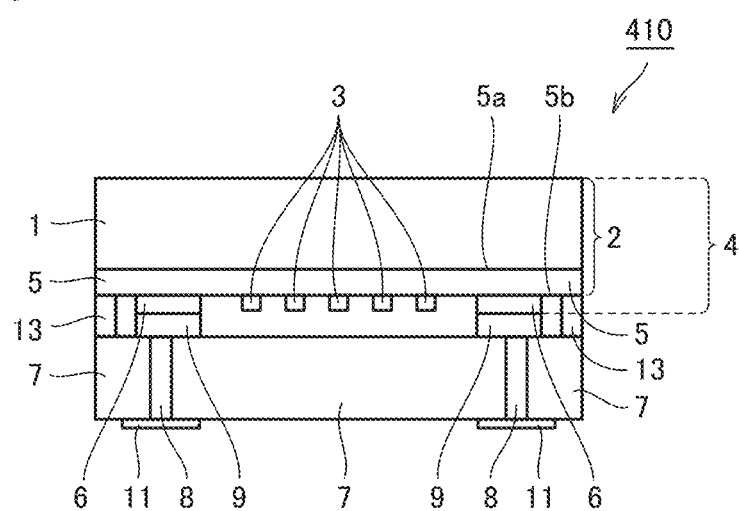
FIG. 4 is a schematic cross sectional view of a surface acoustic wave device in accordance with one embodiment of the present disclosure.

As shown in FIG. 4, a surface acoustic wave device 410 can further include a sealing substrate 7 for sealing electrode 3, in addition to joined substrate 4. Of main surfaces of sealing substrate 7, one main surface facing joined substrate 4 has a second electrode member 9 made of a metallic thin film formed thereon, and the other main surface has an external terminal 11 formed thereon. Second electrode member 9 and external terminal 11 are electrically connected through a via wire 8 penetrating sealing substrate 7.

Since first electrode member 6 and second electrode member 9 are disposed to be in contact with each other in surface acoustic wave device 410, first electrode member 6 and external terminal 11 are also electrically connected through second electrode member 9 and via wire 8.

Joined substrate 4 and sealing substrate 7 are joined through an adhesive member 13. Adhesive member 13 is provided to surround electrode 3, first electrode member 6, and second electrode member 9. Therefore, electrode 3, the first electrode member, and the second electrode member are cut off from the outside and are hermetically sealed. It should be noted that joined substrate 4 and sealing substrate 7 may be directly joined by pressure bonding, without using an adhesive member.

As adhesive member 13, a metal or a resin can be used. As the metal, gold, platinum, silver, copper, aluminum, nickel, titanium, a gold alloy, a metal having a surface coated with gold, or the like can be used. As the resin, an epoxy resin, an acrylic resin, a silicone resin, a polyimide resin, a polyamide resin, a polyamide imide resin, or the like can be used.

As sealing substrate 7, spinel is preferably used. The average thickness of sealing substrate 7 is preferably 10 μm or more and 1000 μm or less.

The thickness of surface acoustic wave device 410 is preferably 110.1 μm or more and 1550 μm or less. Further, main surfaces of surface acoustic wave device 10 preferably have a shape of a rectangle with one side length of 0.1 mm or more and 10 mm or less.

<Method for Manufacturing Surface Acoustic Wave Device>

The method for manufacturing a surface acoustic wave device in accordance with the present embodiment can include a step of preparing a joined substrate, a step of preparing a sealing substrate, and a step of joining the joined substrate and the sealing substrate to obtain a surface acoustic wave device.

(Step of Preparing Joined Substrate)

First, a joined substrate is prepared. The joined substrate can be obtained by forming an electrode on a main surface of the joined body described in the first embodiment. Specifically, first, a surface of piezoelectric substrate 5 in joined body 2 is cleaned by RCA cleaning. Then, an aluminum-based material to serve as an electrode is deposited on the polished surface of piezoelectric substrate 5 by electron beam evaporation to have a thickness of one hundred to several hundred angstroms.

Then, a resist is applied to the polished surface of the piezoelectric substrate with a coater, and is cured by baking. Thereafter, a pattern of the surface acoustic wave device is exposed with a stepper exposure machine, and is developed with a developer.

Then, with a reactive ion etching (RIE) device, the aluminum-based material at a portion not masked with the resist is removed, leaving the aluminum-base material only at an electrode portion. The resist is removed to complete the electrode. Thereby, joined substrate 4 including piezoelectric substrate 5, electrode 3 provided on second main surface 5b of piezoelectric substrate 5, and polycrystalline spinel substrate 1 joined to first main surface 5a of piezoelectric substrate 5 can be obtained. It should be noted that first electrode member 6 can also be formed on second main surface 5b of piezoelectric substrate 5 by the same method as the method for fabricating electrode 3 described above.

It should be noted that, when the surface acoustic wave device is formed only of the joined substrate as shown in FIGS. 2 and 3, the joined substrate obtained above corresponds to surface acoustic wave device 10. When the surface acoustic wave device further includes another component in addition to the joined substrate as shown in FIG. 4, the following steps are further performed.

(Step of Preparing Sealing Substrate)

As sealing substrate 7, for example, a substrate made of spinel is prepared. In the substrate, via wire 8 penetrating the substrate is formed. Then, on one main surface of the substrate, second electrode member 9 is formed to cover via wire 8. In addition, on the other main surface of the substrate, external terminal 11 is formed to cover via wire 8. Thereby, sealing substrate 7 can be obtained.

(Step of Obtaining Surface Acoustic Wave Device)

Then, obtained joined substrate 4 and sealing substrate 7 are joined. First, adhesive member 13 made of a metal or a resin is disposed on second main surface 5b of piezoelectric substrate 5. Then, sealing substrate 7 is disposed to face second main surface 5b of piezoelectric substrate 5. On this occasion, sealing substrate 7 is disposed such that first electrode member 6 contacts second electrode member 9. Then, sealing substrate 7 is pressed against piezoelectric substrate 5 at a constant heating temperature to join sealing substrate 7 and piezoelectric substrate 5 using adhesive member 13, and thereby electrode 3 is hermetically sealed.

Then, joined substrate 4 and sealing substrate 7 are cut into a desired size with the hermetic sealing of electrode 3 being maintained, and thereby surface acoustic wave device 410 can be obtained. Further, surface acoustic wave device 410 may be obtained by cutting joined substrate 4 into a desired size and then joining it to sealing substrate 7.

EXAMPLES

The present embodiment will be further specifically described based on examples. However, the present embodiment is not limited by these examples.

<Fabrication of Joined Body>

(Step of Preparing Piezoelectric Substrate)

As a piezoelectric substrate, a piezoelectric substrate made of lithium tantalate and having an average thickness of 250 μm (indicated as "Average Thickness P-T1" in Table 1) was prepared. The shape of main surfaces of the piezoelectric substrate was a circle, and the diameter thereof was ϕ98 mm.

The main surfaces of the piezoelectric substrate described above were roughly polished by grinding, and thereafter, chemical mechanical polishing (CMP) was performed on a surface to be joined to a polycrystalline spinel substrate, to reduce its surface roughness until it had an arithmetic average roughness (Ra) of about 0.5 nm.

(Step of Preparing Polycrystalline Spinel Substrate)

Powder made of spinel and having a composition formula of $MgO \cdot nAl_2O_3$ (n=1.03) was prepared. The spinel powder had an average particle diameter of 17 μm, and a purity of 99.9%.

Then, the powder made of spinel described above was molded by press molding under a pressure of 10 MPa to obtain a molded body.

Then, the molded body described above was sintered in vacuum at 1675° C. for 4 hours, and thereafter was sintered under conditions of a pressure of 200 MPa and a temperature of 1780° C. for 120 minutes. Thereby, a spinel ingot made of the spinel sintered body was obtained.

Then, the obtained spinel ingot was sliced with a diamond wire saw to have a desired average thickness to obtain a polycrystalline spinel substrate. Here, the desired average thickness was determined in consideration of the thickness of the polycrystalline spinel substrate indicated in the column "Average Thickness P-T2" of the polycrystalline spinel substrate before joining in Table 1, the polishing allowance of main surfaces of the polycrystalline spinel substrate in a subsequent step, and the like. The shape of the main surfaces of the polycrystalline spinel substrate was a circle, and the diameter thereof was ϕ100 mm.

Then, the main surfaces of the polycrystalline spinel substrate described above were roughly polished by grinding, and thereafter, lapping and rough polishing were performed on a surface to be finally joined to the piezoelectric substrate, in a balanced manner such that a load was uniformly applied onto the substrate surface, to reduce variation in the thickness from the back surface such that the surface had a TTV with a value indicated in the column "P-TTV" of the polycrystalline spinel substrate before joining in Table 1. Specifically, the lapping was performed using a single or double-surface lapping machine as a lapping machine, and diamond abrasive grains or the like as a lapping agent. Specifically, the rough polishing was performed using a single or double-surface polishing machine. In both of the lapping and the rough polishing, processing was performed in a balanced manner such that the load was uniformly applied, considering the thickness of a workpiece, the dimensions of a jig, and the like. Further, CMP was performed to reduce the surface roughness until the surface had an arithmetic average roughness (Ra) of about 0.5 nm.

(Joining Step)

Then, the piezoelectric substrate and the polycrystalline spinel substrate prepared above were placed within a vacuum chamber such that the polished surface of the polycrystalline spinel substrate faced the polished surface of the piezoelectric substrate. With this state being maintained, an internal gas within the chamber was exhausted to achieve a high vacuum state. Thereafter, a fast atomic beam of neutralized argon was emitted onto the polished surfaces of the both substrates, and then the both substrates were brought closer to each other and joined to obtain a joined body.

(Step of Adjusting Thickness of Piezoelectric Substrate)

In the joined body obtained above, grinding, lapping, and polishing were performed on the second main surface of the piezoelectric substrate such that thickness T1 of the piezoelectric substrate became equal to a thickness indicated in the column "Average Thickness T1" of the piezoelectric substrate in the joined body in Table 1.

In the obtained joined body, average thickness T2 of the polycrystalline spinel substrate was measured. The result is indicated in the column "Average Thickness T2" of the polycrystalline spinel substrate in the joined body in Table 1. It was confirmed from the result in Table 1 that average thickness P-T2 of the polycrystalline spinel substrate before joining is the same as average thickness T2 of the polycrystalline spinel substrate in the joined body. It should be noted that, since the method of calculating average thickness T1 and average thickness T2 is described in the first embodiment, the description thereof will not be repeated.

The value of T1/T2 was calculated from the obtained values of T1 and T2. The result is indicated in the column "T1/T2" in Table 1.

In the obtained joined body, the TTV of an interface of the polycrystalline spinel substrate with the piezoelectric substrate (corresponding to opposite surface 1b of the polycrystalline spinel substrate) was measured. The result is indicated in the column "TTV" of the polycrystalline spinel substrate in the joined body in Table 1. It was confirmed from the result in Table 1 that the TTV of the polycrystalline spinel substrate before joining ("P-TTV" in Table 1) is the same as the TTV of the polycrystalline spinel substrate in the joined body. It should be noted that, since the method of calculating the TTV is described in the first embodiment, the description thereof will not be repeated.

complete the electrode. It should be noted that a first electrode member was also formed on the second main surface of the piezoelectric substrate by the same method as the method for fabricating the electrode described above.
(Step of Preparing Sealing Substrate)

As a sealing substrate, for example, a substrate made of spinel was prepared. In the substrate, a via wire penetrating the substrate was formed. Then, on one main surface of the substrate, a second electrode member was formed to cover the via wire. In addition, on the other main surface of the substrate, an external terminal was formed to cover the via wire. Thereby, the sealing substrate was obtained.
(Step of Obtaining Surface Acoustic Wave Device)

Then, the obtained joined substrate and sealing substrate were joined. First, an adhesive member made of a resin was disposed on the second main surface of the piezoelectric substrate. Then, the sealing substrate was disposed to face the second main surface of the piezoelectric substrate. On this occasion, the sealing substrate was disposed such that the first electrode member contacted the second electrode member. Then, the sealing substrate was pressed against the

TABLE 1

| | Before Joining | | | Joined Body | | | | | Surface Acoustic Wave Device Temperature | |
|---|---|---|---|---|---|---|---|---|---|---|
| | Piezoelectric Substrate | Polycrystalline Spinel Substrate | | | Polycrystalline Spinel Substrate | | Piezoelectric Substrate | | Coefficient of Frequency | |
| Sample No. | Average Thickness P − T1 (μm) | Average Thickness P − T2 (μm) | P-TTV (μm) | Average Thickness T1 + T2 (μm) | Average Thickness T2 (μm) | TTV (μm) | Average Thickness T1 (μm) | T1/T2 | Average Value (ppm/° C.) | Variation |
| 1 | 250 | 250 | 0.7 | 255 | 250 | 0.7 | 5 | 0.020 | −14.2 | 0.11 |
| 2 | 250 | 250 | 0.7 | 260 | 250 | 0.7 | 10 | 0.040 | −15.0 | 0.12 |
| 3 | 250 | 250 | 0.7 | 275 | 250 | 0.7 | 25 | 0.100 | −17.8 | 0.14 |
| 4 | 250 | 250 | 0.7 | 290 | 250 | 0.7 | 40 | 0.160 | −21.0 | 0.16 |
| 5 | 250 | 500 | 0.7 | 500.1 | 500 | 0.7 | 0.1 | 0.000 | −13.4 | 0.05 |
| 6 | 250 | 500 | 0.7 | 501 | 500 | 0.7 | 1 | 0.002 | −13.5 | 0.05 |
| 7 | 250 | 500 | 0.7 | 503 | 500 | 0.7 | 3 | 0.006 | −13.7 | 0.05 |
| 8 | 250 | 100 | 0.7 | 105 | 100 | 0.7 | 5 | 0.050 | −15.5 | 0.30 |
| 9 | 250 | 150 | 0.7 | 155 | 150 | 0.7 | 5 | 0.033 | −14.8 | 0.19 |
| 10 | 250 | 200 | 0.7 | 205 | 200 | 0.7 | 5 | 0.025 | −14.4 | 0.14 |
| 11 | 250 | 250 | 0.7 | 260 | 250 | 0.7 | 10 | 0.040 | −15.0 | 0.12 |
| 12 | 250 | 300 | 0.7 | 310 | 300 | 0.7 | 10 | 0.033 | −14.8 | 0.10 |
| 13 | 250 | 375 | 0.7 | 385 | 375 | 0.7 | 10 | 0.027 | −14.5 | 0.08 |
| 14 | 250 | 500 | 0.7 | 510 | 500 | 0.7 | 10 | 0.020 | −14.2 | 0.06 |
| 15 | 250 | 250 | 2 | 260 | 250 | 3 | 10 | 0.040 | −15.0 | 0.49 |
| 16 | 250 | 250 | 1.5 | 260 | 250 | 1.5 | 10 | 0.040 | −15.0 | 0.25 |
| 17 | 250 | 250 | 1.2 | 260 | 250 | 1.2 | 10 | 0.040 | −15.0 | 0.20 |
| 18 | 250 | 250 | 0.9 | 260 | 250 | 0.9 | 10 | 0.040 | −15.0 | 0.15 |
| 19 | 250 | 250 | 0.7 | 260 | 250 | 0.7 | 10 | 0.040 | −15.0 | 0.12 |

<Fabrication of Surface Acoustic Wave Device>
(Step of Preparing Joined Substrate)

A surface of the piezoelectric substrate in the joined body described above was cleaned by RCA cleaning. Then, an aluminum-based material to serve as an electrode was deposited on the cleaned surface of the piezoelectric substrate by electron beam evaporation to have a thickness of several hundred angstroms.

Then, a resist was applied to the polished surface of the piezoelectric substrate with a coater, and was cured by baking. Thereafter, a pattern of a surface acoustic wave device was exposed with a stepper exposure machine, and was developed with a developer.

Then, with a reactive ion etching (RIE) device, the aluminum-based material at a portion not masked with the resist was removed, leaving the aluminum-base material only at an electrode portion. The resist was removed to piezoelectric substrate at a constant heating temperature to join the sealing substrate and the piezoelectric substrate using the adhesive member, and thereby the electrode was hermetically sealed.

Then, the joined substrate and the sealing substrate were cut into a size of 1 mm×1 mm with the hermetic sealing of the electrode being maintained. Thereby, surface acoustic wave devices of samples 1 to 19 were obtained.
<Measurement of Temperature Coefficient of Frequency (TCF)>

For each obtained surface acoustic wave device, the temperature coefficient of frequency was measured. The specific method of measuring the temperature coefficient of frequency is as described below.

A network analyzer was connected to an SAW resonator of a surface acoustic wave element for testing, at each of five positions from one substrate. Then, the temperature coefficients of frequency (TCF) of the surface acoustic wave device of each sample were measured while changing the ambient temperature from −40° C. to 85° C., and the average value and variation (standard deviation) thereof were calculated. The results are indicated in the columns "Average Value" and "Variation" in Table 1.

<Evaluation>

In samples 1 to 3, 5 to 14, and 16 to 19, T1/T2, which is the ratio between average thickness T1 of the piezoelectric substrate and average thickness T2 of the polycrystalline spinel substrate, is 0.1 or less, and the polycrystalline spinel substrate has a TTV of 1.5 μm or less in a main surface which contacts the piezoelectric substrate. Accordingly, these samples correspond to examples. In samples 1 to 3, 5 to 14, and 16 to 19, the frequency temperature characteristic was excellent, and variation thereof was also little.

In sample 4, T1/T2 is more than 0.1, and thus sample 4 corresponds to a comparative example. In sample 4, the frequency temperature characteristic was deteriorated, when compared with the examples described above.

In sample 15, TTV is more than 1.5 μm, and thus sample 15 corresponds to a comparative example. In sample 15, variation in frequency temperature characteristic was large, when compared with the examples described above.

Although the embodiments and the examples of the present disclosure have been described above, it is also originally intended to combine or variously modify the features of the embodiments and the examples described above as appropriate.

It should be understood that the embodiments and the examples disclosed herein are illustrative and non-restrictive in every respect. The scope of the present invention is defined by the scope of the claims, rather than the embodiments and the examples described above, and is intended to include any modifications within the scope and meaning equivalent to the scope of the claims.

REFERENCE SIGNS LIST

1, 51: polycrystalline spinel substrate; 1a: back surface; 1b: opposite surface; 2: joined body; 3: electrode; 3a: first pole; 3b: second pole; 4: joined substrate; 5: piezoelectric substrate; 5a: first main surface; 5b: second main surface; 6: first electrode member; 7: sealing substrate; 8: via wire; 9: second electrode member; 10, 410: surface acoustic wave device; 11: external terminal; 13: adhesive member.

The invention claimed is:

1. A joined body, comprising:
   a piezoelectric substrate; and
   a polycrystalline spinel substrate provided on one main surface of the piezoelectric substrate,
   wherein a ratio T1/T2 between T1 and T2 is 0.1 or less, where the T1 represents an average thickness of the piezoelectric substrate and the T2 represents an average thickness of the polycrystalline spinel substrate, and
   wherein a TTV of the polycrystalline spinel substrate is less than or equal to 0.9 μm in a main surface which contacts the piezoelectric substrate.

2. The joined body according to claim 1, wherein the T1/T2 is 0.0002 or more and 0.1 or less.

3. The joined body according to claim 1, wherein
   the T1 is 0.1 μm or more and 25 μm or less, and
   the T2 is 100 μm or more and 500 μm or less.

4. The joined body according to claim 1, wherein the piezoelectric substrate is made of lithium tantalate or lithium niobate.

5. The joined body according to claim 1, wherein
   a total thickness of the T1 and the T2 is 100.1 μm or more and 525 μm or less,
   each main surface of the polycrystalline spinel substrate has a shape of a circle with a diameter of 100 mm or more and 200 mm or less, or a shape with an orientation flat formed in the circle, and
   the joined body has a TTV of 10 μm or less in each outer surface thereof.

6. A surface acoustic wave device comprising:
   the joined body according to claim 1, and
   an electrode provided on a main surface of the piezoelectric substrate opposite to the main surface provided with the polycrystalline spinel substrate.

* * * * *